United States Patent [19]

Koenig

[11] 4,079,372

[45] Mar. 14, 1978

[54] SERIAL TO PARALLEL CONVERTER

[75] Inventor: Harry J. Koenig, San Diego, Calif.

[73] Assignee: The United States of America as represented by the Secretary of the Navy, Washington, D.C.

[21] Appl. No.: 682,010

[22] Filed: May 3, 1976

[51] Int. Cl.² .............................................. G06F 5/04
[52] U.S. Cl. ........................................... 340/347 DD
[58] Field of Search ............. 340/347 DD; 178/26 A, 178/26 R; 235/92 SH

[56] References Cited

U.S. PATENT DOCUMENTS

| | | | |
|---|---|---|---|
| 3,160,876 | 12/1964 | Stochel | 340/347 DD |
| 3,271,517 | 9/1966 | De Rosa | 340/347 DD |
| 3,310,781 | 3/1967 | Diamant | 340/347 DD |
| 3,416,133 | 12/1968 | Hunkins | 235/92 SH |

OTHER PUBLICATIONS

Snyder, "IBM Technical Disclosure Bulletin," vol. 8, No. 2, Jul. 1965 pp. 226–227.

*Primary Examiner*—Charles D. Miller
*Attorney, Agent, or Firm*—R. S. Sciascia; G. J. Rubens; H. Fendelman

[57] ABSTRACT

A serial to parallel converter receives a succession of digital bits in serial form comprising discrete data formats and control formats through its input terminal, which is coupled to a data shift register and to a control shift register. When a data format is coupled into the input, a register enable circuit enables the data register to load and convert sets of changeable data bits, comprising part of the data format, to parallel form. When a control format is coupled into the input, the register enable circuit enables the control shift register to convert sets of changeable control bits, comprising part of the control format, to parallel form. One of the changeable bits in every control format immediately followed by a data format comprises an incoming data indicator. During the period that a control format containing an incoming data indicator is being coupled to the converter, a register selector circuit responds to the indicator by instructing the register enable circuit that the next incoming format will be a data format.

9 Claims, 6 Drawing Figures

SERIAL TO PARALLEL CONVERTER

BACKGROUND OF THE INVENTION

The present invention pertains to serial to parallel (S/P) converters for converting digital information from serial to parallel form, and particularly to S/P converters wherein information contained in incoming serial form control bits asynchronously instructs the converter to convert other information contained in incoming serial form data bits to parallel form.

Devices for converting digital information from serial to parallel form are generally well-known. However, there exists a need in some computer systems for the conversion of digital information which comprises a succession of discrete sets of data bits and control bits, wherein the data bit sets are coupled into the converter at irregular intervals, and a control bit set immediately preceding each data bit set contains an indication that the next following set in the succession of digital information will be a data bit set.

An S/P converter capable of converting this type of information could find application in the High Speed Data Switching System (HSDS) developed to rapidly interconnect computer equipments of the Navy Tactical Data System (NTDS). Each HSDS channel carries information in serial form whereas each NTDS equipment may accept information only in parallel form so that the output of an HSDS channel must be coupled to an NTDS equipment through an S/P converter. In addition, the output of an HSDS channel may comprise a succession of formats, data formats, each of which includes a set of changeable data bits, or data word, to be converted to parallel form, and control formats, each of which includes a set of changeable control bits. At least two control formats are interspersed between every two data formats, and the control bit set of each control format is provided with an indication of whether the next format coming out of the HSDS channel will be another control format or a data format. An S/P converter for coupling the output of an HSDS channel to an NTDS equipment must therefore be responsive to the indicator of each control format so that the converter will be enabled to convert a control bit set during a control format, and a data bit set during a data format. Also, the converter must be capable of a very rapid rate of operation since the output of changeable data bits from the HSDS channel may be at a rate of 10 megabits per second, and the input to the NTDS equipment of converted data words may be at a rate of 125 kilowords per second.

SUMMARY OF THE INVENTION

The present invention discloses a relatively simple S/P converter suitable for the above mentioned purposes and which is particularly well suited for, though by no means restricted to, coupling the serial output of an HSDS channel to the parallel input of an NTDS computer equipment. In its most general application, the S/P converter receives successive serialized sets of $n$ data bits and other sets of $m$ control bits from a source of digital information. Each data bit set coupled into the converter is followed by a varying number of control bit sets, and the last control bit set coming in before a data bit set contains an incoming data indicator. During the period that the bits of a data bit set are being coupled into the converter, a register enable circuit enables a serial to parallel data shift register to shift in the $n$ data bits and then to shift them in parallel form out of $n$ output terminals. Similarly, during the period that the $m$ bits of a control bit set are being coupled into the converter, the register enable circuit enables a serial to parallel control shift register to convert them to parallel form. The S/P converter is further provided with a register selector circuit which receives each incoming data indicator contained in a control bit set and responds to it by instructing the register enable circuit to enable the data shift register when the following set comes into the converter.

STATEMENT OF THE OBJECTS OF THE INVENTION

An object of the invention is to provide an improved means for converting digital information from serial form to parallel form.

Another object is to provide an improved serial to parallel converter which is responsive to control information in serial form to determine the times at which it must convert data information in serial form.

Another object is to provide an improved serial to parallel converter which may receive digital information in serial form at a rate in excess of 10 megabits per second and transmit digital information comprising parallel form data words at a rate in excess of 125 kilowords per second.

Another object is to provide an improved serial to parallel converter which may receive the serial form output of a channel of the HSDS and couple it to the parallel form input of an NTDS computer equipment.

Another object is to provide an improved serial to parallel converter for coupling the output of an HSDS channel to the input of an NTDS equipment which may be timed to operate synchronously with a parallel to serial converter which couples the output of another NTDS equipment to the input of the same HSDS channel.

Other objects, advantages and novel features of the invention will become apparent from the following detailed description of the invention when considered in conjunction with the accompanying drawings.

DESCRIPTION OF THE PREFERRED EMBODIMENT

The embodiment of the disclosed serial to parallel (S/P) converter has an input terminal coupled to the output of a channel of the High Speed Data Switching System (HSDS), four control outputs coupled to the four control input lines of an NTDS computer equipment, and 36 data outputs coupled to the 36 data input lines of the equipment. The input to the S/P converter comprises successive data formats and control formats, both in serial form, wherein the conclusion of either format coincides in time (within a few nanoseconds) with the commencement of another format. Each incoming data format is followed by a varying number of control formats before another data format may be coupled into the S/P converter. Some of the bits of each data format comprise a set of changeable data bits, or data word, coupled to the input of the HSDS channel from the data output lines of a second NTDS equipment. Similarly, some of the bits of each control format comprise a set of changeable control bits constituting the output of the control output lines of the second NTDS equipment at a previous specific point in time. The data and control bit sets of the second equipment may be coupled to the input of the HSDS channel through a parallel to serial (P/S) converter, which may operate synchronously with the S/P converter herein disclosed.

Figure 1A:
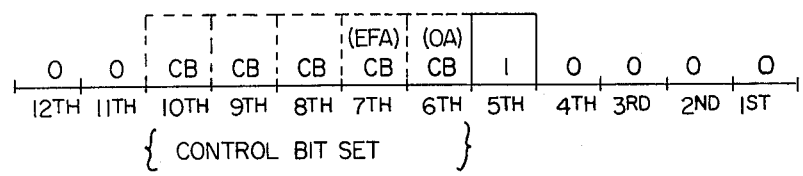
FIG. 1A is a schematic diagram illustrating a control format which may comprise an input to the embodiment of the invention.

FIG. 1A is a schematic diagram of a control format, each of which comprises 12 digital bits. The S/P converter commences a control format when the first bit at the extreme right of FIG. 1A is applied to its input terminal, and each of the other 11 bits is successively coupled to the converter input at 100 nanosecond intervals so that 1200 nanoseconds are required for the entire control format to be coupled into the converter. The first through fourth bits of each control format are "0"'s and the fifth bit is a control start bit, which always has a value of "1." The control start bit "1" provides conversion signals to the S/P converter during a control format. The sixth through tenth bits of each control format comprise the set of control bits (CB) previously referred to, which is converted to parallel form. Each control bit is changeable in that it may be at one logic state in one set and at the other state in another set. After conversion the sixth through ninth bits are coupled to the four control input lines of the coupled NTDS equipment, and, the tenth bit of the control format is coupled to an external terminal of the S/P converter for purposes unrelated to converter operation.

The sixth and seventh control bits of each control format are the Output Acknowledge (OA) and External Function Acknowledge (EFA) bits, respectively. By definition of the NTDS the OA and EFA bits may not both be "1" in the same control format. However, they may both be "0" in the same control format, and any control format with this condition may be immediately followed by one or more control formats in which the OA and EFA bits are also both "0." Similarly, a control format in which the OA (or EFA) bit is "1" may be immediately followed by one or more control formats also having an OA (or EFA) bit of "1" or by one or more control formats in which the OA (or EFA) bit has made a transition to "0." However, in the NTDS, the transition of an OA (or EFA) bit from "0" to "1" indicates the occurrence of a data bit set, or data word. Consequently, any control format having an OA (or EFA) bit of "1" which immediately follows a control format in which the OA (or EFA) bit was "0" must in turn be immediately followed by a data format so that the OA (or EFA) bit of "1" of the immediately following control format comprises an incoming data indicator. It may be seen that to have a transition of an OA (or EFA) bit from "0" to "1," in order to generate an incoming data indicator, at least two control formats must occur between data formats.

Figure 1B:
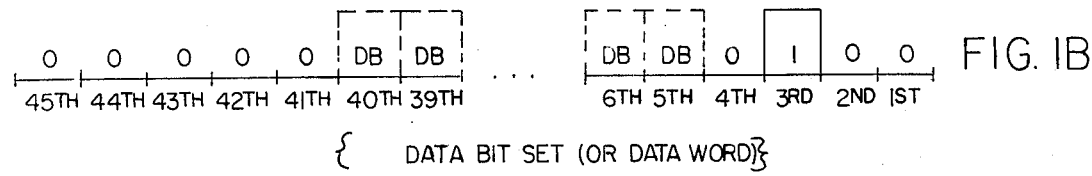
FIG. 1B is a schematic diagram illustrating a data format which may comprise another input to an embodiment of the invention.

FIG. 1B illustrates a data format comprising 45 digital bits. The S/P converter commences a data format when the first bit to the extreme right of FIG. 1B is applied to its input terminal, and each of the other 45 bits is successively coupled to the converter input at 100 nanosecond intervals so that 4500 nanoseconds are required to couple the entire data format into the S/P converter. The first two bits of each data format are always "0"'s, the third bit is a data start bit "1," and the fourth bit is a data start bit "0". The two data start bits provide conversion signals to the converter during a data format. The fifth through 40th bits comprise the set of data bits (DB), or data word, previously referred to, which is converted to parallel form by the converter and then coupled to the 36 data input lines of the coupled NTDS equipment. Each data bit is changeable in that it may be at one logic state in one set and at the other state in another set. The final five bits of each data format are always "0." The embodiment of the S/P converter may receive the changeable bits of successive data formats from the HSDS channel at a rate of 10 megabits per second and convert and couple the converted data bit sets, or data words, to the NTDS equipment at a rate of 125 kilowords per second.

Figure 2:
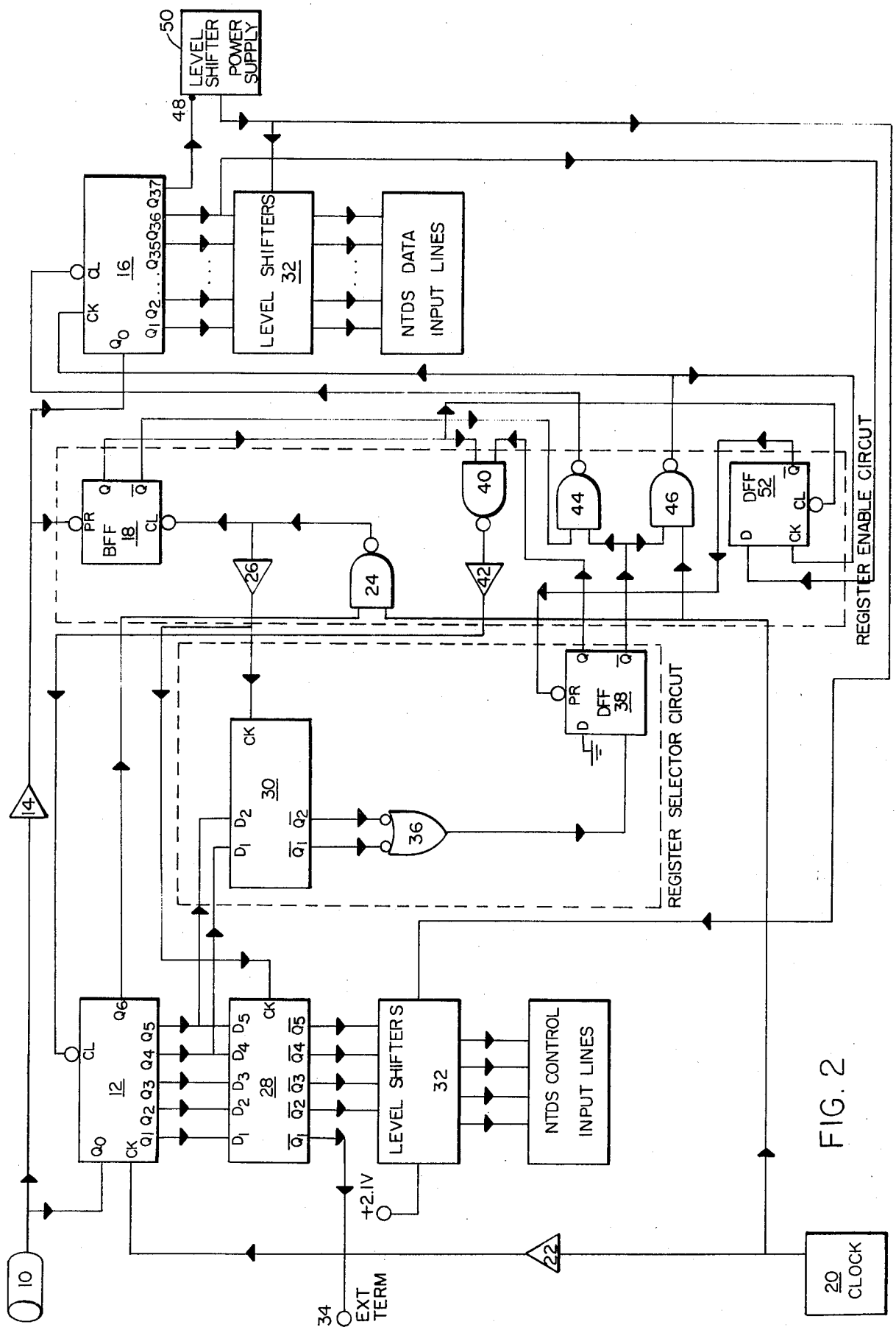
FIG. 2 is a schematic diagram illustrating an embodiment of the present invention.

FIG. 2 illustrates the components of an S/P converter and their interconnections, in accordance with the present invention, wherein input terminal 10, which may comprise a coaxial cable connector, may be coupled to the output of a channel of the HSDS. Input terminal 10 is coupled to the input terminal $Q_0$ of control shift register 12, which may be an 8 bit S/P TTL shift register, and is also coupled through inverter 14 to the input terminal $Q_0$ of data shift register 16, which may comprise five 8 bit TTL S/P shift registers connected in series. The output of inverter 14 is also coupled to the low true preset (PR) terminal of busy flipflop (BFF) 18 so that a "1" applied to the input of terminal inverter 14 will be inverted to a "0" and preset BFF 18, whereupon the output Q of BFF 18 becomes "1" and its inverted output $\overline{Q}$ becomes "0."

Register 12 and 16 each has a positive edge clock (CK) terminal, a low true clear (CL) terminal, one input terminal and a plurality of output terminals. Control register 12 has output terminals $Q_1$ through $Q_6$ and data register 16 has 37 output terminals $Q_1$ through $Q_{37}$. Each register operates in a well known manner wherein if the register is uncleared by the application of a "1" to its CL terminal, it is enabled to shift in digital bits in serial form and shift them out in parallel form, the bit at $Q_i$ moving to $Q_{i+1}$ each time the register is clocked. Since it has a positive edge clock terminal, each register is clocked by a clock pulse coupled to its CK terminal, each clock pulse being a signal making a transition from a "0" state to a "1" state. Either register is disabled to convert digital information if it is cleared, by the application of a "0" to its CL terminal, or if "0" to "1" transitions are not coupled to its CK terminal.

Clock 20, which may be any suitable source of clock pulses, provides periodic symmetrical clock pulses of 50 nanoseconds duration so that there are 100 nanosecond periods between the positive edges of the clock pulses. The positive edge of each clock pulse coincides with the application of a bit of either format to terminal 10. Clock 20 may also time the operation of the above mentioned P/S converter coupling the second NTDS equipment to the HSDS channel input to achieve synchronous operation between the P/S converter and the S/P converter of the present embodiment.

The pulses from clock 20 are coupled through inverter 22 to the CK terminal of control register 12 so that control register 12 is always clocked by negative edges of pulses from clock 20 rather than by the positive edges. Output terminal $Q_6$ of register 12 is coupled to an input of NAND gate 24 so that six clock pulses are required to shift a bit from the $Q_0$ terminal of register 12 to the input of NAND gate 26. The other input of NAND gate 24 is provided by clock 20. The output of NAND gate 24 is coupled to the low true CL terminal of BFF 18 and also through inverter 26 to the CK terminals of latches 28 and 30 so that whenever the output of NAND gate 24 falls from "1" to "0," BFF 18 is cleared and latches 28 and 30 are clocked.

Each of the outputs $Q_1$ through $Q_5$ of register 12 is coupled through latch 28 to the same numbered inverted output $\overline{Q}_1$ through $\overline{Q}_5$ of latch 28. Each of the inverted outputs $\overline{Q}_2$ through $\overline{Q}_5$ of latch 28 is coupled through one of four level shifters 32 to one of the four control input lines of the coupled NTDS equipment, and inverted output $\overline{Q}_1$ of latch 28 is coupled to external terminal 34 for purposes unrelated to converter operation, as previously stated. Each level shifter 32 functions to shift the TTL voltage of the converter (wherein 0 volts corresponds to a logic "0," and 5 volts corresponds to a logic "1") to the NTDS voltage level (wherein −15 volts corresponds to a logic "0" and 0 volts corresponds to a logic "1"). Also, each level shifter functions as an inverter. Consequently, whenever latch 28 is clocked the output $Q_1$ of control register 12 is instantaneously (within a few nanoseconds) inverted and coupled to external terminal 34, and each of the outputs $Q_2$ through $Q_5$ of control register 12 is coupled to its NTDS control input line through its level shifter 32 when its level shifter receives power. Each level shifter 32 requires power from a voltage source of 2.1 volts. The level shifters coupled to inverted outputs $\overline{Q}_2$ and $\overline{Q}_3$ of latch 28 receive power from a constant voltage source of 2.1 volts, and the level shifters coupled to inverted outputs $\overline{Q}_4$ and $\overline{Q}_5$ of latch 28 are coupled to a level shifter power supply to be described.

Terminals $Q_4$ and $Q_5$ of register 12 are also coupled to the low true input terminals of OR gate 36 through the inverted outputs $\overline{Q}_1$ and $\overline{Q}_2$, respectively, of latch 30. Consequently, whenever latch 30 is clocked the inversions of the outputs of terminals $Q_4$ and $Q_5$ of register 12 comprise the inputs to OR gate 36. The output of OR gate 36 is coupled to "D" flipflop (DFF) 38, which has a D input terminal coupled to ground. DFF 38 operates in a well-known manner, wherein each time it receives a clock pulse at its CK terminal, its output Q assumes the same state as its D input terminal, and its inverted output $\overline{Q}$ assumes the opposite state. DFF 38 is further provided with a low true PR terminal so that it is preset by the application of a "0" to its PR terminal.

Latch 30, OR gate 36 and DFF 38 together comprise a register selector circuit which is responsive to the OA and EFA bits contained in each control format. Whenever a control format containing an incoming data indicator, as previously defined, is coupled into the converter, the register selector circuit responds to the data indicator by setting the converter for operation in a data format at the conclusion of the control format containing the data indicator.

The output Q of DFF 38 and the output Q of BFF 18 provide the inputs to NAND gate 40, which is coupled through inverter 42 to the low true CL terminal of control register 12 which clears or unclears control register 12 when its output is "1" or "0," respectively. The inverted output $\overline{Q}$ of DFF 38 and the inverted output $\overline{Q}$ of BFF 18 provide the inputs to NAND gate 44, which clears or unclears data register 16 when its output is "0" or "1," respectively. The inverted output $\overline{Q}$ of DFF 38 also provides an input to NAND gate 46, which receives its other input from clock 20, and which has its output coupled to the CK terminal of data register 16. Consequently, when the inverted output $\overline{Q}$ of DFF 38 is "0" the output of NAND gate 46 is always "1" so that register 16 may not be clocked. However, when $\overline{Q}$ of DFF 38 is "1," gate 46 is controlled by clock 20, and the pulses of clock 20 are coupled to the CK terminal of data register 16.

Each of the output terminals $Q_1$ through $Q_{36}$ of register 16 is coupled through a level shifter 32 to one of the 36 data input lines of the coupled NTDS equipment. Output terminal $Q_{37}$ of register 18 is coupled to the input terminal 48 of level shifter power supply 50, which supplies 2.1 volts to each level shifter 32 coupled to the data input lines whenever it is switched on by the application of a "1" to its input terminal 48. Power supply 50 also powers the level shifters coupled to $\overline{Q}_4$ and $\overline{Q}_5$ of latch 28, so that outputs $Q_4$ and $Q_5$ of register 12 are always coupled to the NTDS equipment simultaneously with the coupling of the outputs of register 16 to the NTDS equipment. Level shifter power supply 50 is provided to prevent serial data ripple on the parallel NTDS interface.

Terminal $Q_{36}$ of register 16 is also coupled to the D terminal of DFF 52, which is clocked by the output of gate 46. If a "1" output of terminal $Q_{36}$ of register 16 is clocked into DFF 52, the inverted output $\overline{Q}$ of DFF 52 becomes "0," presetting DFF 38. DFF 52 is cleared whenever the output Q of BFF 18 is "0."

Clock 20 times the operation of the S/P converter during each control and each data format. BFF 18, NAND gates 24, 40, 44 and 46 and DFF's 38 and 52 together comprise a register enable circuit which enables control register 12 to convert the control bit set of each control format to parallel form and to enable data register 16 to convert the data bit set of each data format to parallel form.

Figure 3:
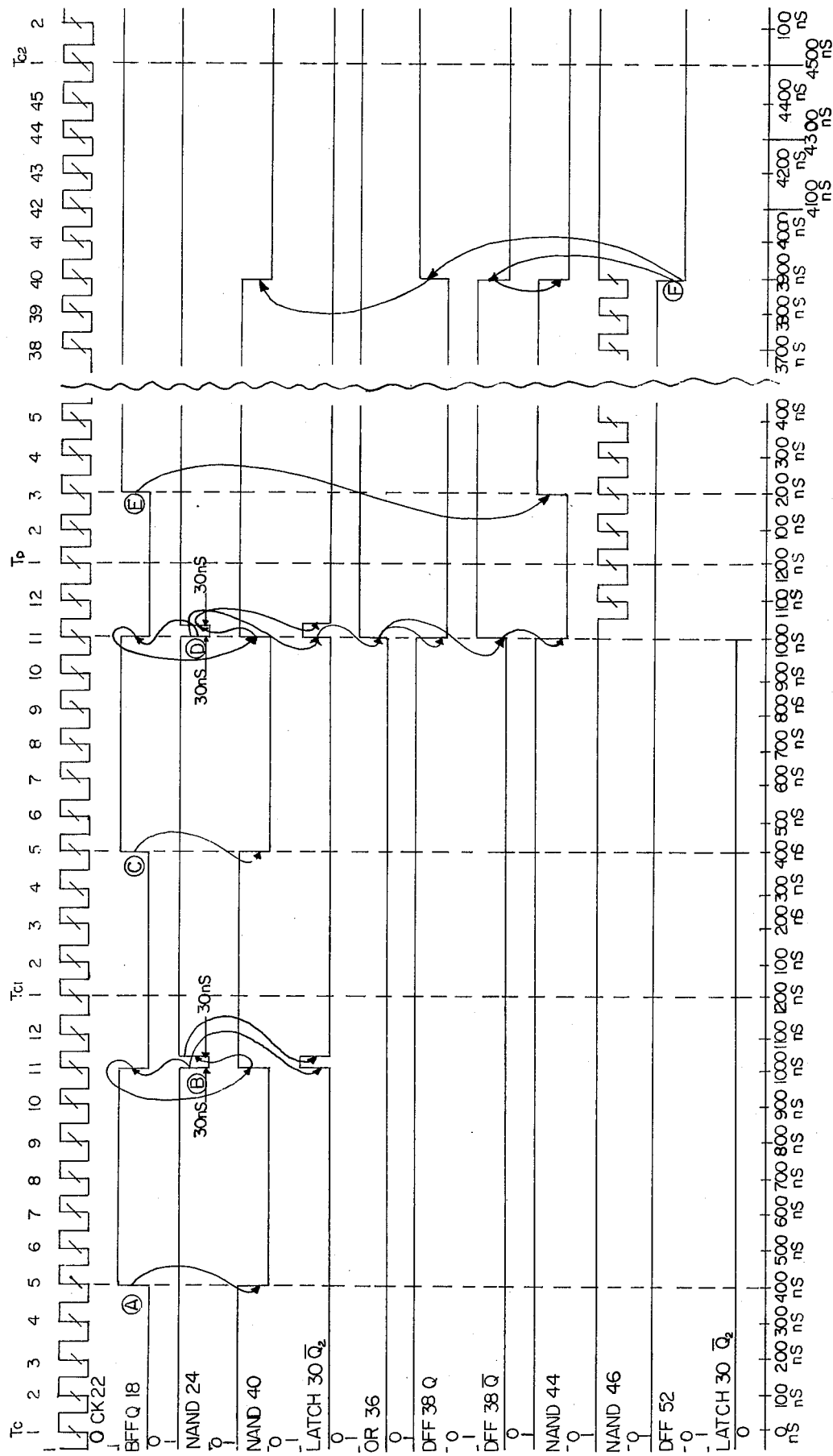
FIG. 3 illustrates waveforms of specific points of the embodiment of FIG. 2.

The interaction and coordination of the components of the disclosed embodiment may be more perfectly understood by reference to FIG. 3, which illustrates the outputs of clock 20 and of components of the register selector circuit and register enable circuit during a succession of formats. In addition, FIG. 3 illustrates the signal coupled to the CK terminal of latch 30 from NAND gate 24. A first control format commences at time $T_C$ and concludes at time $T_{C1}$, a second control format commences at time $T_{C1}$ and concludes at time $T_D$, and a data format commences at time $T_D$ and concludes at time $T_{C2}$. Each of the numbers above the waveforms indicates the number of positive edge clock pulses from clock 20 that have occurred during a format at a given time after the commencement of the format. Each of the letters A through F illustrates a change in state of the output of a component caused by some event, wherein the change of state causes the output of one or more other components to change states. Each of the arrows of FIG. 3 illustrates a change of states of one output causing a change of states in another output.

If the first bit of the first control format, wherein the OA and EFA bits are both 0, is coupled to terminal 10 of the converter at $T_C$, the control start bit "1" is coupled to the converter 400 nanoseconds after $T_C$, and is applied to terminal $Q_0$ of register 12 and inverter 14 for 100 nanoseconds thereafter. The control start bit "1" is inverted by inverter 14 so that BFF 18 is preset, which event is denoted by A of FIG. 3, so that, as previously described, the output Q of BFF 18 rises from "0" to "1." This change of states in the output Q of BFF 18 in turn causes the output of NAND gate 40 to fall from "1" to "0," applying a "0" to the CL terminal of control register 12 so that control register 12 is uncleared.

At 450 nanoseconds after $T_C$, the output of inverter 22 (the inverted output of clock 20, as previously described) rises from "0" to "1" so that register 12 is clocked and the control start bit "1," still applied to terminal $Q_0$, is shifted to terminal $Q_1$. Successive inverted clock pulses from inverter 22 shift the control start bit "1" to successive terminals $Q_i$ and simultaneously shift successive bits of the incoming control bit set into and through control register 12, until 950 nanoseconds after $T_C$. At this time the control start bit "1" is shifted to terminal $Q_6$, the OA control bit is shifted to terminal $Q_5$, the EFA control bit to terminal $Q_4$ and the remaining control bits to terminals $Q_3$, $Q_2$ and $Q_1$. Since the other input of NAND gate 24 is coupled directly to clock 20, an interval of 50 nanoseconds elapses before both of the inputs to NAND gate 24 become "1." At the end of this interval, 1000 nanoseconds after $T_C$, the application of a "1" to both inputs of NAND gate 24 causes the output of NAND gate 24 to fall to "0," which event is denoted by B of FIG. 3. This change, in turn, causes a series of other events to occur. The "0" output of NAND gate 24 clears BFF 18 so that its output Q falls to "0" and its inverted output $\overline{Q}$ (not shown) rises to "1." Simultaneously, latch 28 is clocked so that the four control bits at outputs $Q_2$ through $Q_5$ of register 14 are coupled to their respective level shifters 32 and the control bit at $Q_1$ is coupled to external terminal 34. Also, the OA and EFA control bits at $Q_5$ and $Q_4$ are inverted and coupled to the input terminals of OR gate 36 when latch 30 is clocked. Since both the OA and EFA bits are "0," two "1"s are applied to the inputs of OR gate 36 and OR gate 36 remains in the "0" state, as shown. It may be noted that if the output of OR gate 36 had been in the "1" state at $T_C$, the application of the inverted OA and EFA bits to its input terminals 1000 nanoseconds after $T_C$ would have caused its output to fall to "0," such transition, however would not have affected DFF 38, which has a positive edge clock.

When the output Q of BFF 18 falls to "0," the output of NAND gate 40 rises to "1," clearing control register 12 so that the output of terminal $Q_6$ falls to "0" which, in turn, causes the output of NAND gate 24 to rise back to "1".

It may be seen from FIG. 3 that during a control format, control register 12 is enabled to shift in digital bits only during the portion of a control format when the control start bit "1" and the five control bits are applied to its input terminal 10.

At $T_{C1}$, 1200 nanoseconds after $T_C$, the first bit of the second control format is coupled to input terminal 10 wherein the OA (or EFA) bit must be "1" if the second control format is to be followed by a data format, as previously stated. During the first 1000 nanoseconds of the second control format, the converter operates as it did during the same period of the first control format, the unclearing of register 12 at 400 nanoseconds after $T_{C1}$, being denoted by C of FIG. 3. However, 1000 nanoseconds after $T_{C1}$ the output of NAND gate 24 falls to "0," which event is devoted by D of FIG. 3., whereupon latch 30 is clocked and the inverted OA and EFA control bits are coupled to the inputs of OR gate 36. With a "0" and a "1" coupled to its inputs, OR gate 36 makes a transition from "0" to "1." This transition in turn clocks DFF 38 so that the output Q of DFF 38 falls to "0" and its inverted output $\overline{Q}$ rises to "1." When the inverted output $\overline{Q}$ of DFF 38 rises to 1, the output of NAND gate 44 falls to "0," (thereby clearing register 16), since its inputs, the inverted output $\overline{Q}$ of BFF 18 and the inverted output $\overline{Q}$ of DFF 38, have both risen to "1." Simultaneously, the inverted output $\overline{Q}$ of DFF 38 applies a "1" to NAND gate 46, enabling the output of NAND gate 46 to reflect its other input, which is provided by clock 20. Consequently, after this time NAND gate 46 couples clock pulses from clock 20 to the CK terminal of data register 16.

At $T_D$, 1200 nanoseconds after $T_{C1}$, the first bit of the data format is coupled to input terminal 10 but may not be shifted into data register 16 since register 16 remains cleared. However, the data start bit "1," 200 nanoseconds after $T_D$, is inverted by inverter 14 to "0" and presets BFF 18 which event is denoted by E of FIG. 3. When $\overline{Q}$ of BFF 18 falls from "1" to "0," the output of NAND gate 44 rises from "0" to "1" so that data register 16 becomes uncleared and enabled to shift in subsequent bits of the data format on subsequent clock pulses. Consequently, 300 nanoseconds after $T_D$, the data start bit "0," inverted to "1" by inverter 14 is shifted into data register 16 to output terminal $Q_1$. Subsequent clock pulses shift in the 36 bits of the data bit set of the data format, each bit being inverted by inverter 14.

3800 Nanoseconds after $T_D$, the inverted data start bit "0," inverted to a "1" state by inverter 14 is shifted to terminal $Q_{36}$ of register 16 so that a "1" is coupled to the "D" terminal of DFF 52. On the rising edge of the next clock pulse from clock 20, 3900 nanoseconds after $T_D$, the "1" is clocked into DFF 52, whereupon its inverted output $\overline{Q}$ falls to "0" which event is denoted by F of FIG. 3. The "0" output of $\overline{Q}$ of DFF 52 presets DFF 38 so that its output Q rises to "1" and its inverted output $\overline{Q}$ falls to "0." The "1" at output Q of DFF 38 causes NAND gate 40 to fall to "0." NAND gate 46 is held at "1," so that data register 16 may no longer be clocked.

The clock pulse at 3900 nanoseconds after $T_D$ also shifts each of the data bits of the incoming data bit set so that there is a data bit at each terminal $Q_1$ through $Q_{36}$ at 3900 nanoseconds after $T_D$. The inverted start bit "0," inverted to the "1" state, is simultaneously shifted to $Q_{37}$ so that level shifter power supply 50 is turned on to provide power to each level shifter 32 coupled to each of the terminals $Q_1$ through $Q_{36}$ of register 16 and also to provide power to the level shifter coupling outputs $Q_4$ and $Q_5$ of control register 12 to their NTDS input control lines. When the level shifters 32 are switched on, the 36 bits of the data bit set, or data word are coupled in parallel form into the data input lines of the NTDS, and the OA and EFA control bits of the previous control format (one of which is "1") are coupled to the NTDS input control lines. It may be noted that during a data format, data register 16 is enabled to shift in digital bits only during the period of the data format when the data start bit "0" and the bits of the data bit set of the data format are applied to the register input. It may be further noted that at $T_{C2}$, 4500 nanoseconds after $T_D$, a third control format commences, during which DFF 52 is cleared when NAND gate 24 falls to "0" and the output Q of BFF 18 falls from "1" to "0," 1000 nanoseconds after $T_{C2}$.

Finally, it may be seen that by providing a positive edge CK terminal for DFF 38, which regulates the enabling and disabling of data register 16, the occurrence of a data format must be defined by two immediately preceeding control formats, wherein the first causes the output of OR gate 36 to be "0" and the second causes the output of gate 36 to make a transition to "1."

Figure 4:
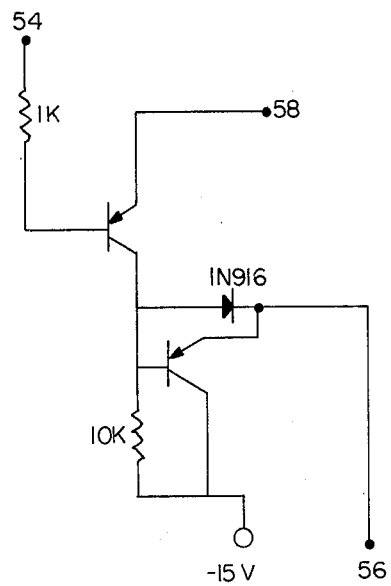
FIG. 4 is a schematic diagram illustrating a level shifter for use with the embodiment of FIG. 2.

FIG. 4 illustrates a level shifter 32 which has its input 54 coupled to an inverted output $\overline{Q}_i$ of latch 28 and its output terminal 56 coupled to one of the control input lines of the coupled NTDS equipment, or else having its input 54 coupled to an output terminal $Q_i$ of register 16 and its output 56 coupled to a data input line of the NTDS. Each level shifter 32 comprises two resistors, two PNP transistors, and a diode coupled together as shown. Each level shifter is operative when a voltage source of 2.1 volts is coupled to its voltage supply terminal 58, but is dormant when 0 volts is coupled to terminal 58.

Figure 5:
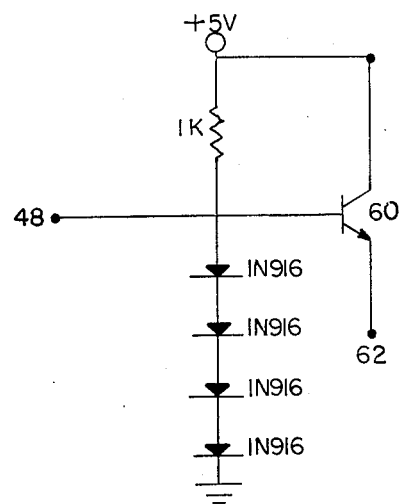
FIG. 5 is a schematic diagram illustrating a level shifter power supply for use with the embodiment of FIG. 2.

FIG. 5 illustrates level shifter power supply 50 having its input terminal 48 which may be coupled to output terminal $Q_{37}$ of data register 16. NPN transistor 60 has its collector coupled to a 5 volt source, and its emitter may be coupled to the terminals 58 of level shifters 32 through output terminal 62. When 5 volts (TTL logic "1") is applied to input terminal 48, the output of terminal 62 will be 2.1 volts. When the input at terminal 48 is 0 volts (TTL logic "0") the output of terminal 62 will be 0.

Obviously many modifications and variations of the present invention are possible in the light of the above teachings. It is therefore to be understood that within the scope of the appended claims the invention may be practiced otherwise than as specifically described.

What is claimed is:

1. An apparatus for accepting digital information in serial form and providing digital information in parallel form, wherein said serial form digital information comprises a succession of serial form digital bits having equal time durations, and wherein some of the serial form digital bits comprise discrete data formats and other of the serial form digital bits comprise discrete control formats so that a succession of formats are coupled into the input of the apparatus, each data format being followed in the format succession by a plurality of control formats before another data format occurs, and one or more of the digital bits comprising selected control formats are incoming data indicators, each of said selected control formats being immediately followed in the format succession by a data format, said apparatus comprising:
   a. a data shift register means having an input terminal coupled to the input of the apparatus and having output terminals coupled to a data output of the apparatus, for serially receiving a plurality of the digital bits comprising a data format and for converting the received bits to parallel form and coupling them to the data output of the apparatus;
   b. a control shift register means having an input terminal coupled to the input of the apparatus and having output terminals coupled to a control output of the apparatus, for serially receiving a plurality of the digital bits comprising a control format and for converting the received bits to parallel form and coupling them to the control output of the apparatus;
   c. a register enable circuit means coupled to said data shift register means and also to said control shift register means for enabling said data shift register means to receive, convert and couple out a plurality of the digital bits comprising a data format, and for enabling the control shift register means to receive, convert and couple out a plurality of the digital bits comprising each control format;
   d. a timing means coupled to said register enable circuit means for timing the operation of said data shift register means and of said control shift register means;
   e. a register selector circuit means coupled to said register enable circuit means and situated to receive each of said incoming data indicators, said register selector circuit means for responding to a received incoming data indicator by instructing said register enable circuit means to enable said data shift register means to receive, convert and couple out a plurality of the digital bits comprising a data format.

2. The apparatus of claim 1 wherein said register selector circuit means has an input operably coupled to said control shift register means.

3. An apparatus for accepting digital information in serial form and providing digital information in parallel form, wherein said serial form digital information comprises a succession of serial form digital bits having equal time durations, and wherein some of the serial form digital bits comprise discrete data formats and other of the serial form digital bits comprise discrete control formats so that a succession of formats is coupled into the input of the apparatus, each data format being followed in the format succession by a plurality of control formats before another data format occurs, and one or more of the digital bits comprising selected control formats are incoming data indicators, each of said selected control formats being immediately followed in the format succession by a data format, said apparatus comprising:
   a. a data shift register means having an input terminal coupled to the input of the apparatus and having output terminals coupled to a data output of the apparatus, for serially receiving a plurality of the digital bits comprising a data format and for converting the received digital bits to parallel form and coupling them to the data output of the apparatus during the time period that the bits comprising the data format are being coupled into the apparatus;
   b. a control shift register means having an input terminal coupled to the input of the apparatus and having output terminals coupled to a control output of the apparatus, for serially receiving a plurality of the digital bits comprising a control format and for converting the received bits to parallel form and coupling them to the control output of the apparatus during the time period that the digital bits comprising the control format are being coupled into the apparatus;
   c. a register enable circuit means coupled to said data shift register means and also to said control shift register means for enabling said data shift register means to receive, convert and couple out a plurality of the digital bits comprising a data format during the time period that the bits comprising the data format are being coupled into the apparatus and for enabling the control shift register means to receive, convert and couple out a plurality of the digital bits comprising a control format during the time period that the bits of the control format are being coupled into the apparatus;

d. a timing means coupled to said register enable circuit means for timing the operation of said data shift register means and of said control shift register means;

e. a register selector circuit means coupled to said register enable circuit means and situated to receive each of said incoming data indicators, said register selector means for responding to a received incoming data indicator during the time period that the digital bits comprising the selected control format containing the indicator are being coupled into the converter, by instructing said register enable circuit means to enable said data shift register means to receive, convert and couple out a plurality of the digital bits comprising the data format immediately following the said selected control format.

4. The apparatus of claim 3 wherein said register selector circuit means has an input operably coupled to said control shift register means.

5. The apparatus of claim 3 wherein said data shift register means and said control shift register means each comprises a serial to parallel shift register means having a single input terminal, a plurality of output terminals, a clock terminal and a clear terminal, each of said shift register means being enabled to receive digital bits through its input terminal in serial form and to couple the received bits out of its output terminals in parallel form only when clock pulses are coupled to its clock terminal and its clear terminal is at a specified logic state.

6. The apparatus of claim 5 wherein said timing means comprises a clock providing periodic symmetrical clock pulses, wherein each of said clock pulses has the same time duration as each of said serial form digital bits, and wherein each of said serial form digital bits is coupled into said apparatus synchronously with one of said clock pulses.

7. The apparatus of claim 6 wherein said register enable circuit means and said register selector circuit means each comprises a network of interconnected logic circuit components.

8. The apparatus of claim 7 wherein each of said data formats is comprised of an equal number of digital bits, some of the bits of each data format comprising a set of changeable data bits and other bits of each data format comprising a data conversion signal, and wherein each of said control formats is comprised of an equal number of digital bits, some of the bits of each control format comprising a set of changeable control bits and other bits of each control format comprising a control conversion signal.

9. The apparatus of claim 8 wherein one or more of the said logic circuit components of the register enable circuit means is responsive to the said data conversion signal of each data format and to the said control conversion signal of each control format for enabling the data shift register means to receive, convert and couple out only the digital bits of each data format which comprise the said set of changeable data bits, and for enabling the control shift register means to receive, convert and couple out, only the digital bits of each control format which comprise the said sets of changeable control bits.

* * * * *